United States Patent
Lamesch

(10) Patent No.: US 9,285,406 B2
(45) Date of Patent: Mar. 15, 2016

(54) IMPEDANCE MEASUREMENT SYSTEM

(75) Inventor: Laurent Lamesch, Echternach (LU)

(73) Assignee: IEE INTERNATIONAL ELECTRONICS & ENGINEERING S.A., Luxembourg (LU)

( * ) Notice: Subject to any disclaimer, the term of this patent is extended or adjusted under 35 U.S.C. 154(b) by 75 days.

(21) Appl. No.: 14/131,367

(22) PCT Filed: Jun. 29, 2012

(86) PCT No.: PCT/EP2012/062741
§ 371 (c)(1),
(2), (4) Date: Jan. 7, 2014

(87) PCT Pub. No.: WO2013/007542
PCT Pub. Date: Jan. 17, 2013

(65) Prior Publication Data
US 2014/0111226 A1    Apr. 24, 2014

(30) Foreign Application Priority Data

Jul. 8, 2011    (LU) .......................................... 91839

(51) Int. Cl.
*G01R 27/26* (2006.01)
*H03K 17/955* (2006.01)
*H03K 17/96* (2006.01)
*G01D 5/24* (2006.01)

(52) U.S. Cl.
CPC ............. *G01R 27/2605* (2013.01); *G01D 5/24* (2013.01); *H03K 17/955* (2013.01); *H03K 17/962* (2013.01); *H03K 2217/94031* (2013.01)

(58) Field of Classification Search
CPC .. G01R 27/26; G01R 27/2605; H03K 17/955; H03K 2217/94031; H03K 17/962; G01D 5/24
USPC .................................. 324/691–724, 654–657
See application file for complete search history.

(56) References Cited

U.S. PATENT DOCUMENTS

| | | | | |
|---|---|---|---|---|
| 3,348,145 A * | 10/1967 | Erath | ........................ | 324/762.08 |
| 3,417,328 A * | 12/1968 | Tiemann | ........................ | 324/654 |
| 3,750,146 A * | 7/1973 | Lucas | ........................... | 341/118 |
| 4,912,660 A * | 3/1990 | Kuipers et al. | ................... | 702/65 |
| 5,657,238 A * | 8/1997 | Lindeboom | ..................... | 702/65 |

(Continued)

FOREIGN PATENT DOCUMENTS

WO          0106472       1/2001

OTHER PUBLICATIONS

International Search Report for corresponding application PCT/EP2012/062741 filed Jun., 29, 2012; Mail date Aug. 2, 2012.

(Continued)

*Primary Examiner* — Huy Q Phan
*Assistant Examiner* — Lamarr Brown
(74) *Attorney, Agent, or Firm* — Cantor Colburn LLP

(57) ABSTRACT

In an impedance measurement system, a reference impedance (2) to be measured is periodically connected and disconnected by means of switch (3) in parallel to the unknown impedance (1) to be measured. The thus generated amplitude modulation of the measurement current is demodulated, and the amplitude of the demodulated signal is indicative of the reference impedance to be measured. Using a low frequency modulation of the reference impedance enables to measure the impedance of the reference impedance without disconnecting the unknown impedance.

6 Claims, 1 Drawing Sheet

(56) References Cited

U.S. PATENT DOCUMENTS

| | | | |
|---|---|---|---|
| 6,987,394 B1* | 1/2006 | Drost | G01R 27/2605 |
| | | | 324/658 |
| 2003/0009273 A1 | 1/2003 | Stanley et al. | |
| 2004/0004488 A1* | 1/2004 | Baxter | G01D 5/24 |
| | | | 324/678 |
| 2004/0095148 A1* | 5/2004 | Hilliard et al. | 324/654 |
| 2005/0218913 A1* | 10/2005 | Inaba | G01D 5/24 |
| | | | 324/678 |
| 2007/0247172 A1* | 10/2007 | Li | H03K 17/962 |
| | | | 324/687 |
| 2009/0045825 A1* | 2/2009 | Eng, Jr. | 324/713 |
| 2009/0217757 A1* | 9/2009 | Nozawa | 73/504.12 |
| 2011/0001491 A1* | 1/2011 | Huang | G06F 3/0416 |
| | | | 324/658 |
| 2011/0074446 A1* | 3/2011 | Chou | G06F 3/0428 |
| | | | 324/679 |
| 2013/0141121 A1* | 6/2013 | Lamesch | H03K 17/955 |
| | | | 324/681 |
| 2013/0176039 A1* | 7/2013 | Lamesch | H03K 17/955 |
| | | | 324/683 |
| 2014/0009176 A1* | 1/2014 | Saeedi | G01R 27/2605 |
| | | | 324/681 |

OTHER PUBLICATIONS

J.R. Smith, "Electric Field Sensing for Graphical Interfaces" Computer Graphics I/O Devices, Issue May/Jun. 1998, pp. 54-60.
Written Opinion Report for corresponding application PCT/EP2012/062741 filed Jun. 29, 2012; Mail date Aug. 2, 2012.

* cited by examiner

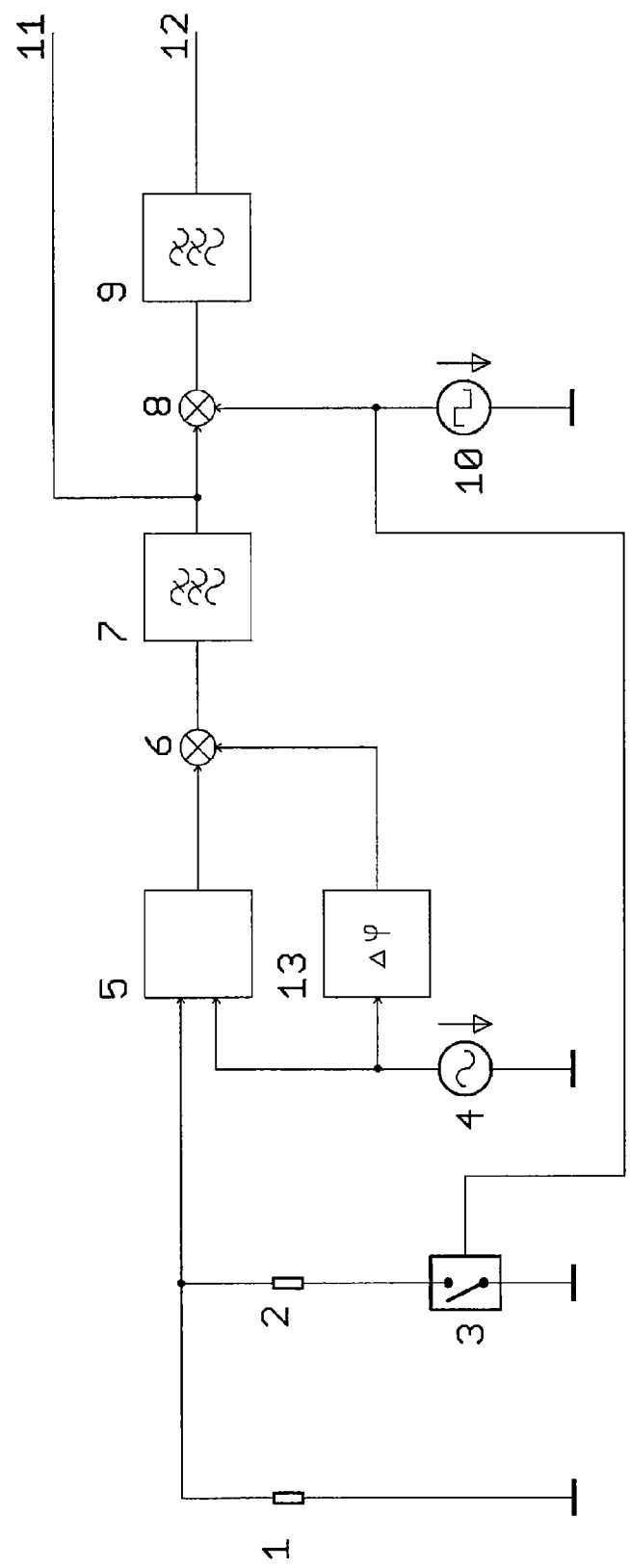

IMPEDANCE MEASUREMENT SYSTEM

TECHNICAL FIELD

The present invention generally relates to the technical field of impedance measurement circuits and more specifically to a capacitive measurement system having one or more electrodes, in which the characteristics of a conductive body such as shape and location are determined by means of capacitive coupling via the electrically conductive body. The present invention may e.g. be used in a capacitive occupant detection system, e.g. for detecting the absence or presence of an occupant seated on a vehicle seat.

BACKGROUND

Capacitive measurement and/or detection systems have a wide range of applications, and are among others widely used for the detection of the presence and/or the position of conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which an oscillating electric signal is applied and which in response emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

In some (so-called "loading mode) capacitive occupancy sensors, the one or more antenna electrodes serve at the same time as sensing electrodes. In this case, the measurement circuit determines the current flowing into the one or more antenna electrodes in response to an oscillating voltage being applied to them. The relationship of voltage to current yields the complex impedance of the one or more antenna electrodes. In an alternative version of capacitive sensors ("coupling mode" capacitive sensors), the transmitting antenna electrode(s) and the sensing electrode(s) are separate from one another. In this case, the measurement circuit determines the current or voltage that is induced in the sensing electrode when the transmitting antenna electrode is operating.

The different capacitive sensing mechanisms are explained in the technical paper entitled "Electric Field Sensing for Graphical Interfaces" by J. R. Smith, published in Computer Graphics I/O Devices, Issue May/June 1998, pp 54-60. The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

The capacitive coupling is generally determined by applying an alternative voltage signal to a capacitive antenna electrode and by measuring the current flowing from said antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the electrode.

An impedance measurement system often further comprises a reference impedance, which can be connected in parallel to the unknown impedance to be determined. In order to calibrate the system, it is desired to periodically measure the impedance of the reference impedance which is connected in parallel to the unknown impedance. Such measurement of the reference impedance should preferably be made without disconnecting the unknown impedance to be measured.

BRIEF SUMMARY

The invention provides an impedance measurement system, which enables the measurement of the impedance of a reference impedance which is connected in parallel to the unknown impedance to be measured, without disconnecting the unknown impedance to be measured.

In order to overcome the above-mentioned problem, the present invention proposes that the reference impedance to be measured is periodically connected and disconnected in parallel to the unknown impedance to be measured. The thus generated amplitude modulation of the measurement current is demodulated, and the amplitude of the demodulated signal is indicative of the reference impedance to be measured. Using a low frequency modulation of the reference impedance enables to measure the impedance of the reference impedance without disconnecting the unknown impedance.

BRIEF DESCRIPTION OF THE DRAWINGS

A preferred embodiment of the invention will now be described, by way of example, with reference to the accompanying drawing in which:

FIG. 1 is a schematic circuit diagram of an impedance measurement system according to an embodiment of the invention.

DETAILED DESCRIPTION

FIG. 1 shows a preferred embodiment of the invention. In this FIG. 1, the reference signs denote the following elements:

1 is the unknown impedance to be measured. In a capacitive occupant detection system, 1 is typically a network composed of one or more capacitance(s) and one or more resistance(s). 2 is the reference impedance. In a typical implementation, 2 is a fixed capacitor of known value. 3 is an electronic switch which switches the reference impedance 2 in parallel to the unknown impedance 1. 3 can be a bipolar transistor for example.

Reference sign 4 denotes an AC voltage generator, generating for example a sine wave of 100 kHz at an amplitude of 1 V. 5 is a transimpedance amplifier whose measurement input (top input in FIG. 1) is connected to the unknown impedance 1 and selectively paralleled reference impedance 2, and whose reference input (bottom input in FIG. 1) is connected to the AC voltage generator 4. The transimpedance amplifier 5 keeps its measurement input substantially at the same voltage than its reference input, thereby keeping the AC voltage across the unknown impedance 1 and the series connection of reference impedance 2 and switch 3 at the same known AC voltage than the output of the AC voltage generator 4, in this example at a frequency of 100 kHz and an amplitude of 1 V.

As said AC voltage is fixed, the current flowing into measurement input of the transimpedance amplifier 5 is indicative of the unknown impedance 1 and the selectively paralleled reference impedance 2. The transimpedance amplifier 5 transforms the current into its measurement input into am AC voltage at its output which is indicative of the current into the measurement input.

A demodulator 6 and following filter 7 demodulate said AC voltage. Demodulator 6 can for example be a multiplier, a switching mixer or a synchronous rectifier. Demodulator 6 receives at its local oscillator input a phase shifted version of the output of AC voltage generator 4, the phase shift being generated by phase shifter 13, thus permitting the measurement of complex unknown impedances by for example first setting the phase shift of phase shifter 13 to 0 degrees, performing a first measurement, then setting the phase shift of phase shifter 13 to 90 degrees and performing a second measurement, and finally combing the results of the two said measurements.

A low frequency AC generator 10 generates a signal of substantially lower frequency than AC generator 4. In the present example, low frequency AC generator 10 generates a square wave of 1 kHz at an amplitude of 5 V. It follows that through the connection between low frequency generator 10 and electronic switch 3, the reference impedance 2 is periodically connected and disconnected in parallel to the unknown impedance 1 with a frequency of 1 kHz. Due to the combination of the permanent connection of unknown impedance 1 and periodically paralleled reference impedance 2, the output of filter 7 will be a DC voltage superimposed by a low frequency AC voltage, said DC voltage being indicative of the impedance of the unknown impedance 1, and said low frequency AC voltage being indicative of the reference impedance 2.

The DC voltage at circuit output 11 can then be measured by an ADC (analog to digital converter) and then averaged to remove said AC components by a microcontroller not shown in FIG. 1. Said microcontroller also generates the appropriate timing for switching the phase of the phase shifter 13, and can also replace the low frequency AC voltage generator 10 by using for example a PWM (pulse width modulation) output or a general purpose output as low frequency AC voltage source.

The frequency of the low frequency AC voltage at output of filter 7 having the same frequency than the frequency of low frequency AC generator 10, the amplitude of said low frequency AC voltage can be measured by demodulating said low frequency AC voltage by a second demodulator 8 whose local oscillator input is driven by low frequency AC generator 10. Demodulator 8 can for example be a multiplier, a switching mixer or a synchronous rectifier. A DC voltage indicative of the impedance of the reference impedance 2 appears then at the output 12 of filter 9. A second ADC input of said microcontroller measures the DC voltage at output 12, and by using the known value of the reference impedance 2, the DC voltage at circuit output 11, and the DC voltage at circuit output 12, the microcontroller calculates the impedance of the unknown impedance 1.

Demodulator 8 and filter 9 can also, similarly to the low frequency generator 10, be replaced by the microcontroller mentioned above. In this case, the samples of the ADC input connected to circuit output 11 are not only averaged to generate the DC value mentioned above indicative to the impedance of unknown impedance 1, but the samples can also be multiplied in software by a periodical square wave or sine wave whose frequency corresponds to the 1 kHz in this example, and then averaged, similarly to the action of demodulator 8 and filter 9.

The transimpedance amplifier 5 and demodulator 6 in this example can also be replaced by a current mode demodulator followed by a low frequency transimpedance amplifier.

The connection order of the demodulators and filters can also be exchanged, that is, the second low frequency demodulator 8 can precede the first demodulator 6. In this case, in order to be able to measure the unknown impedance 1, the low frequency demodulator 8 must be either switched to a continually conducting inactive stated, or simply bypassed by an electronic switch.

The low frequency demodulator 8 can also precede the transimpedance amplifier 5 if it is a current mode demodulator.

In another preferred embodiment, only the first demodulator 6 is used as shown in FIG. 1, and the low frequency AC demodulation is done indirectly be modulating the local oscillator input of demodulator 6 by the low frequency AC signal generated by low frequency AC source 10. Again, in this case in order to be able to measure the permanently connected unknown impedance 1, the low frequency modulation of the local input of demodulator 6 must be switched off.

In another preferred embodiment, the low frequency AC generator 10 does not generate a periodic signal, but a random signal, for example a PRN (pseudo random noise) sequence.

In another preferred embodiment, a second reference impedance and a second electronic switch in series with the second reference impedance are connected in parallel to the unknown impedance. In addition to the low frequency modulation of the first and second reference impedances, both reference impedances can be selectively enabled and disabled. This is necessary if the value of the first reference impedance must be checked for safety reasons. In a first reference impedance measurement, the first reference impedance is measured. In a second reference impedance measurement, the second reference impedance is measured. The two measured values are then compared. If they differ by a predetermined amount, the measurement system assumes that at least one reference impedance is not reliable any more, and flags an error.

The invention claimed is:

1. An impedance measurement system, comprising a control and detection circuit operatively connected to an unknown impedance to be measured, said control and detection circuit comprising a first AC signal generator for generating a first AC signal to be operatively applied to said unknown impedance and a first measurement circuit for measuring a current flowing into said unknown impedance, said control and detection circuit further comprising a reference impedance which is operably connectable in parallel to said unknown impedance by means of a switch, wherein said control and detection circuit is configured for periodically connecting and disconnecting said reference impedance in parallel to said unknown impedance, thereby generating a modulated current measurement signal, wherein said control and detection circuit further comprises a transimpedance amplifier that receives at a first input the modulated current measurement signal indicative of the unknown impedance and the selectively paralleled reference impedance, and receives at a second input at an AC reference voltage, and is configured to transform the modulated current measurement into an AC measurement voltage at its output, wherein said control and detection circuit comprises a demodulation circuit configured to demodulate an amplitude of said AC measurement voltage indicative of said modulated current measurement signal, the amplitude of the AC measurement voltage corresponding to the demodulated current measurement signal being indicative of said reference impedance such that removing said amplitude of said AC measurement voltage from an amplitude of said reference AC voltage leaves remaining a DC voltage signal indicative of said unknown impedance.

2. The impedance measurement system according to claim 1, wherein said control and detection circuit comprises a second AC signal generator for generating a second AC signal, said second AC signal having a lower frequency than said first AC signal, said second AC signal generator being operatively connected to said switch for controlling the operation of said switch and to said demodulation circuit for demodulating an amplitude of said modulated measurement signal.

3. The impedance measurement system according to claim 2, wherein said second AC signal is a periodic signal or a random signal, specifically a pseudo random noise sequence.

4. The impedance measurement system according to claim 1, further comprising a reference impedance element to provide a reference impedance, a fixed capacitor of known value, and an electronic switch that switches the reference impedance in parallel to the unknown impedance to form a capacitive measurement system that measures the unknown impedance.

5. The impedance measurement system of claim 1, wherein said transimpedance amplifier is further configured to maintain its measurement input substantially at a same voltage as said reference AC voltage, thereby maintaining an AC voltage across the unknown impedance and the series connection of reference impedance and switch at the reference AC voltage.

6. The impedance measurement system of claim 1, wherein the demodulation circuit includes a demodulator filter that receives the AC measurement signal and outputs the DC voltage signal superimposed by a low frequency AC voltage, said DC voltage signal being indicative of the impedance of the unknown impedance, and said low frequency AC voltage being indicative of the reference impedance.

\* \* \* \* \*